United States Patent
Li et al.

(10) Patent No.: US 7,796,971 B2
(45) Date of Patent: Sep. 14, 2010

(54) MIXER/DAC CHIP AND METHOD

(75) Inventors: Yunchu Li, Andover, MA (US); Bernd Schafferer, Gloucester, MA (US)

(73) Assignee: Analog Devices, Inc., Norwood, MA (US)

( * ) Notice: Subject to any disclaimer, the term of this patent is extended or adjusted under 35 U.S.C. 154(b) by 812 days.

(21) Appl. No.: 11/686,620

(22) Filed: Mar. 15, 2007

(65) Prior Publication Data
US 2008/0224908 A1 Sep. 18, 2008

(51) Int. Cl.
H04B 1/16 (2006.01)
H04B 15/00 (2006.01)
H03M 1/66 (2006.01)

(52) U.S. Cl. .................. 455/334; 455/333; 455/313; 455/189.1

(58) Field of Classification Search .......... 455/189.1, 455/293, 190.1, 165.1, 183.1, 196.1, 216, 455/313, 333, 334; 341/126, 144
See application file for complete search history.

(56) References Cited

U.S. PATENT DOCUMENTS

| 3,978,473 | A | 8/1976 | Pastoriza |
| 4,020,486 | A | 4/1977 | Pastoriza |
| RE31,850 | E | 3/1985 | Pastoriza |
| 6,369,735 | B1 * | 4/2002 | Yang ................. 341/144 |
| 6,549,153 | B2 * | 4/2003 | Eriksson et al. ......... 341/144 |
| 6,822,595 | B1 * | 11/2004 | Robinson ............ 341/144 |
| 6,842,132 | B2 | 1/2005 | Schafferer |
| 6,967,609 | B1 * | 11/2005 | Bicakci et al. ......... 341/144 |
| 7,034,733 | B2 * | 4/2006 | Dedic et al. ............. 341/150 |
| 7,098,830 | B2 * | 8/2006 | Lin et al. .................. 341/144 |
| 7,221,300 | B2 * | 5/2007 | Fontaine et al. .......... 341/136 |
| 7,548,742 | B2 * | 6/2009 | Johnson ................. 455/313 |
| 2006/0128347 | A1 * | 6/2006 | Piriyapoksombut et al. . 455/333 |
| 2006/0261875 | A1 * | 11/2006 | Breems et al. ............. 327/359 |

FOREIGN PATENT DOCUMENTS

WO WO 2006/051349 5/2006

OTHER PUBLICATIONS

Luschas, Susan et al., "Radio Frequency Digital-to-Analog Converter," IEEE Journal of Solid-State Circuits, vol. 39, No. 9, Sep. 2004, pp. 1462-1467.
Luschas, Susan et al., "A 942 MHz Output, 17.5 MHz Bandwidth, -70dBc IMD3 ΣΔ DAC," IEEE 2003 Custom Integrated Circuits Conference, pp. 131-134.
Authorized Officer Henk Beindorff, International Search Report—International Application No. PCT/US2008/052300, dated Jun. 16, 2008, together with the Written Opinion of the International Searching Authority, 10 pages.

* cited by examiner

Primary Examiner—Sonny Trinh
(74) Attorney, Agent, or Firm—Sunstein Kann Murphy & Timbers LLP

(57) ABSTRACT

An electronic chip has a data input for receiving an input digital data signal with a data frequency, a plurality of switches, and a logic circuit operatively coupled with both the plurality of switches and the data input. The logic circuit controls the switches to be in one of a DAC mode or a mixer mode. The DAC mode causes the switches to convert the input digital data signal into a DAC analog signal having about the data frequency. The mixer mode, however, causes the switches to convert the input digital data signal into a mixed analog signal having a mixer frequency that is higher than the data frequency.

20 Claims, 6 Drawing Sheets

MIXER/DAC CHIP AND METHOD

FIELD OF THE INVENTION

The invention generally relates to integrated circuits and, more particularly, the invention relates to mixers and digital-to-analog conversion circuits.

BACKGROUND OF THE INVENTION

A wide variety of different electronic devices use a system that both converts internal digital signals to analog signals, and then shifts the frequency of the resultant analog signal. For example, conventional cell phones often have a digital-to-analog converter chip that converts a digitally processed voice signal into an analog baseband signal for transmission. Before transmission, however, a mixer chip shifts the frequency of the baseband signal to a frequency that facilitates transmission.

Use of two or more chips to perform these functions can be inefficient.

SUMMARY OF THE INVENTION

In accordance with one embodiment of the invention, an electronic chip has a data input for receiving a digital data signal with a data frequency, a plurality of switches, and a logic circuit operatively coupled with both the plurality of switches and the data input. The logic circuit controls the switches to be in one of a DAC mode or a mixer mode. The DAC mode causes the switches to convert the digital data signal into a DAC analog signal having about the data frequency. The mixer mode, however, causes the switches to convert the data signal into a mixer analog signal having a mixer frequency that is higher than the data frequency. For example, the mixer mode may cause the switches to generate an analog signal that is the mixed product of a digital input signal and a clock signal. Since the clock signal frequency is much higher than the input signal frequency, the resultant analog signal has a higher frequency.

In some embodiments, the chip also has a clock input for receiving a clock signal having a clock frequency. The frequency of the mixer analog signal is a function of the clock frequency (e.g., clock frequency plus or minus input digital signal frequency). For example, the mixer frequency may increase when the clock frequency increases, and decrease when the clock signal decreases.

The data input may have an interface for receiving a given number of bits representing the digital data signal. In that case, the plurality of switches has a total number of switches that is the product of the given number of bits and four. For example, if the given number of bits representing the digital data signal is eight, then the system has thirty-two switches.

The plurality of switches may have a first pair of switches coupled to a first switch output node, and a second pair of switches coupled to a second switch output node. The logic illustratively controls the pairs to ensure that no more than one of the switches in the two pairs is closed at a single time. In addition, if the clock has a clock input for receiving a clock signal, then the logic circuit may control the two pairs of switches so that no one of their switches is closed for two consecutive half-cycles of the clock signal.

Moreover, if the logic circuit produces four control signals, then each of the switches in the two pairs of switches may receive one of the four control signals. As an example, the logic circuit may forward a given one of the four control signals to one of the switches when in the DAC mode. When in the mixer mode, however, the logic circuit forwards the given control signal to another of the switches. To that end, the logic circuit may forward the given control signal to one of the switches in the first pair when in the DAC mode, and, alternatively, to one of the switches in the second pair when in the mixer mode.

In accordance with another embodiment of the invention, a mixer chip has a data input for receiving a digital data signal having a data frequency, first and second pairs of switches, and a differential output having a first node and a second node. The first pair of switches is coupled with the first node while the second pair of switches is coupled with the second node. The mixer chip also has a logic circuit using a clock signal with a clock frequency. The logic circuit causes the first pair and second pair to alternatively produce a signal on their respective nodes for each half-cycle of the clock signal. Accordingly, the differential output produces an analog output signal.

In accordance with other embodiments of the invention, a method provides a first pair of switches coupled with a first output node, and a second pair of switches coupled with a second output node. The two pairs of switches are on a single chip. The method also receives a clock signal having a clock frequency, and a digital data signal having a data frequency. The switches produce an output signal on no more than one of the first and second output nodes. The method selects whether the switches are to be in a mixer mode or a DAC mode. Specifically, the switches cooperate to convert the digital data signal into an analog data signal having when in the DAC mode. When in the mixer mode, however, the switches cooperate to switch the output signal between the first and second output nodes every half-cycle of the clock signal.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In one embodiment of the invention, a single chip can convert and mix a digital signal. For example, when in one mode, the chip can simply convert a digital signal to an analog signal without providing mixing functionality. When in another mode, however, the chip can both convert a digital signal to an analog signal, and provide mixing functionality. In illustrative embodiments, the same internal chip components are used in both modes.

Figure 1:
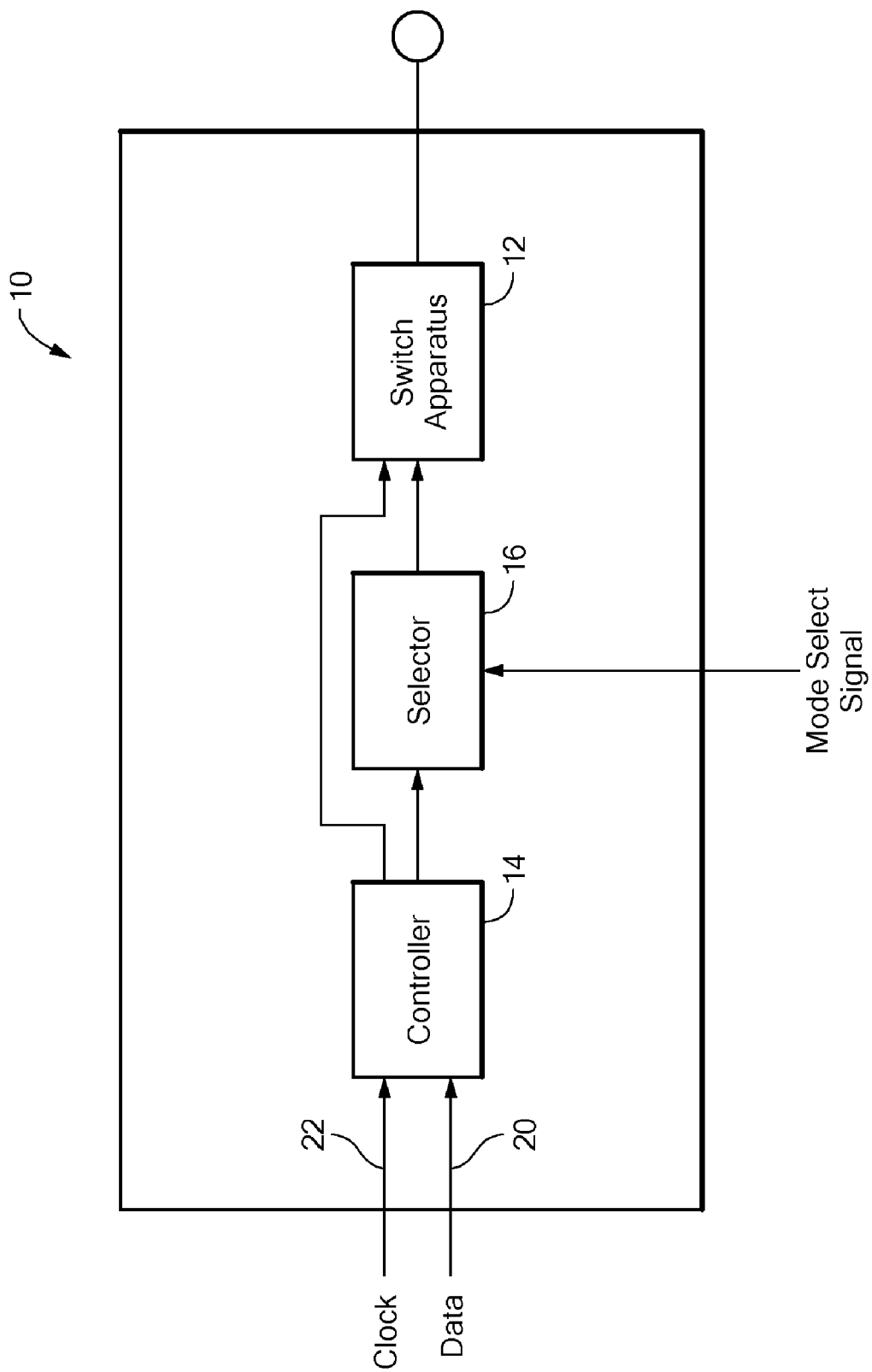
FIG. 1 schematically shows a circuit chip implementing an integrated mixer and digital-to-analog converter in accordance of illustrative embodiments of the invention.

FIG. 1 schematically shows a circuit chip 10 implementing an integrated mixer and digital-to-analog converter in accordance of illustrative embodiments of the invention. It should be noted that FIG. 1 is a simplified block diagram and thus, is not intended to be limited to its specific components. For example, the chip 10 may have a differential output rather than a single ended output. As another example, the chip 10 may have a number of other functional modules, such as an internal clock.

The chip 10 shown in FIG. 1 has, among other things, a mixer/digital-to-analog converter module (for convenience, referred to herein as "switch apparatus 12") that may be switched between 1) a DAC mode for simply converting an incoming digital signal into a corresponding analog signal, and 2) a mixer mode for mixing an incoming digital signal, thus producing a higher frequency analog signal.

More specifically, as known by those skilled in the art, a mixer typically multiplies an incoming signal to shift its underlying frequency. For example, when used within a cellular telephone, a mixer may significantly increase the frequency of a given signal for subsequent modulation by means of a high frequency RF transmission (e.g., 2.4 gigahertz signal). Accordingly, when in the mixer mode, the switch apparatus 12 typically generates an analog output signal having a different frequency than that of the input digital signal it receives.

Other functional modules in the circuit chip 10 enable this dual-mode functionality. Specifically, the circuit chip 10 also has a controller module ("controller 14") that processes an input digital data signal and clock signal to produce control signals for internal switches within the switch apparatus 12. As discussed in greater detail below with regard to FIG. 4, in illustrative embodiments, the controller 14 has a plurality of logic circuits that alternatively turn off and on switches within the switch apparatus 12. Turning the switches on and off in a prescribed manner provides the desired analog output.

Of course, the output depends upon the mode of the chip 10. Accordingly, in addition to the controller 14, the chip 10 also has a selector module ("selector 16") for switching the mode of the chip 10. As discussed in greater detail below with regard to FIG. 5, the selector 16 sets the mode of the chip 10 depending upon the value of a mode select signal. For example, when the mode select signal has a value of one, the chip 10 may be in the mixer mode. Conversely, when the mode select signal has a value of zero, the chip 10 may be in the DAC mode. It should be noted that the values of "one" and "zero" discussed herein represent logical values and not necessarily any actual unit (e.g., volts).

Figure 2:
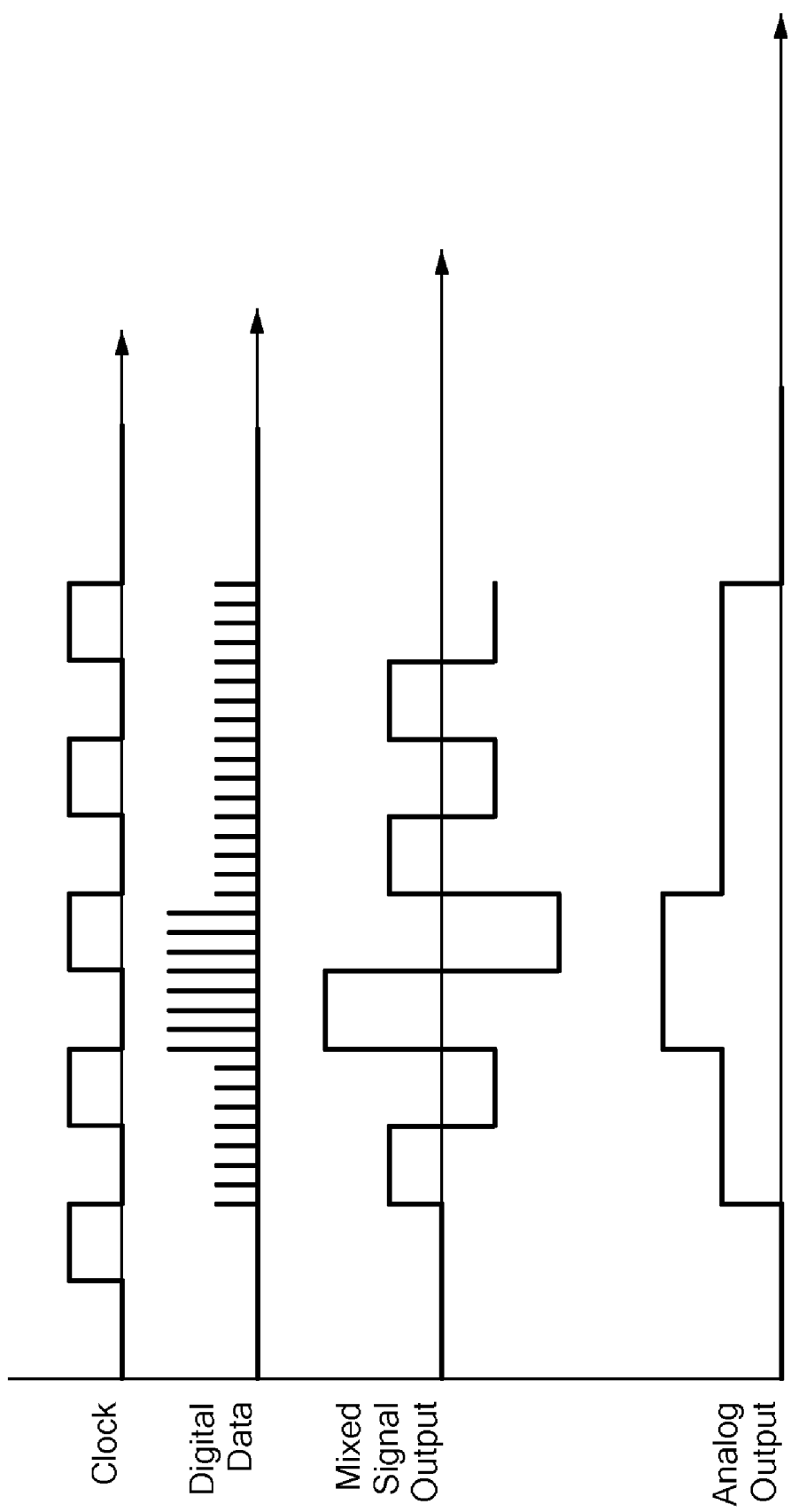
FIG. 2 schematically shows an illustrative graphical representation of the performance of the circuit chip shown in FIG. 1.

FIG. 2 graphically shows input and output signals of the switch apparatus 12. Specifically, the signal identified as "clock" is a simple clock signal showing five clock periods, while the signal identified as "digital data" is an arbitrary digital waveform to be processed by the chip 10 during those five clock periods. For example, the digital data signal may be a processed voice signal on a cellular telephone. Conventional synchronizing logic (not shown) ensures that the digital data signal remains constant during each clock cycle (i.e., during each clock period).

As shown in FIG. 1, the chip 10 receives the clock signal at a clock input 22, and the digital data signal at a data input 20. Each of these inputs 20 and 22 may have one or more bits for receiving signals having amplitudes that are greater than one. For discussion purposes, the clock signal simply is a periodic square wave having an amplitude of logical one. The digital data signal, however, can have a greater positive or negative amplitude. In the example shown in FIG. 2, the digital data signal is a train of pulses having the following logical amplitudes at the following clock periods:

Period 1 (i.e., first 360 degrees of the clock): 0 (binary 0000)

Period 2 (i.e., second 360 degrees of the clock): +1 (binary 0001)

Period 3 (i.e., third 360 degrees of the clock): +2 (binary 0010)

Period 4 (i.e., fourth 360 degrees of the clock): +1 (binary 0001)

Period 5 (i.e., fifth 360 degrees of the clock): +1 (binary 0001)

As noted above, the output of the chip 10 depends on the mode of the chip 10; namely, the chip 10 generates an analog output signal approximating the input digital data signal when in the DAC mode, and a mixed output signal when in the mixer mode. FIG. 2 shows both output signals generated from the digital data signal and clock signal. Specifically, the signal identified as "analog output" simply is the analog version of the digital data signal. Accordingly, this analog output signal should have a frequency that is substantially the same as the digital data signal.

The signal identified as "mixed signal output," however, also is an analog signal, but has a much higher frequency than that of the digital data signal. In fact, the amplitude of the mixed signal fluctuates between a positive and negative amplitude during each half cycle of the clock signal. For example, during the second clock cycle, the mixed signal has an amplitude of +1 the first half cycle, and an amplitude of −1 for the second half cycle. For the third clock cycle, the mixed signal has an amplitude of +2 for the first half cycle, and an amplitude of −2 for the second half cycle. During these two clock cycles, the digital data signal has a constant amplitude of +1 and +2, respectively.

The frequency of the clock signal should have no significant effect on the frequency of the analog output signal—it simply should be analog representation of the digital data signal. The accuracy of the digital to analog conversion process is generally independent of the clock frequency. However, a higher clock frequency may facilitate the design of a reconstruction filter.

The frequency of the clock signal, however, should have a significant impact on the frequency of the mixed signal. More specifically, as discussed above, the amplitude of the mixed signal changes polarity during each half cycle of the clock signal. Accordingly, the frequency of the clock signal may be selected as a function of the application in which the chip 10 is to be used. For example, the clock signal may have a frequency of about 2.4 GHz when used within a cellular telephone having a modulation frequency of about 2.4 GHz. In other words, an increase in the clock frequency should have a corresponding increase in the frequency of the mixed signal. In a corresponding manner, a decrease in the clock frequency should have a corresponding decrease in the frequency of the mixed signal. The mixed analog signal frequency generally is the clock signal frequency plus or minus the input digital signal frequency. In some embodiments, however, the mixed analog signal frequency generally is a multiple of the clock signal.

Figure 3:
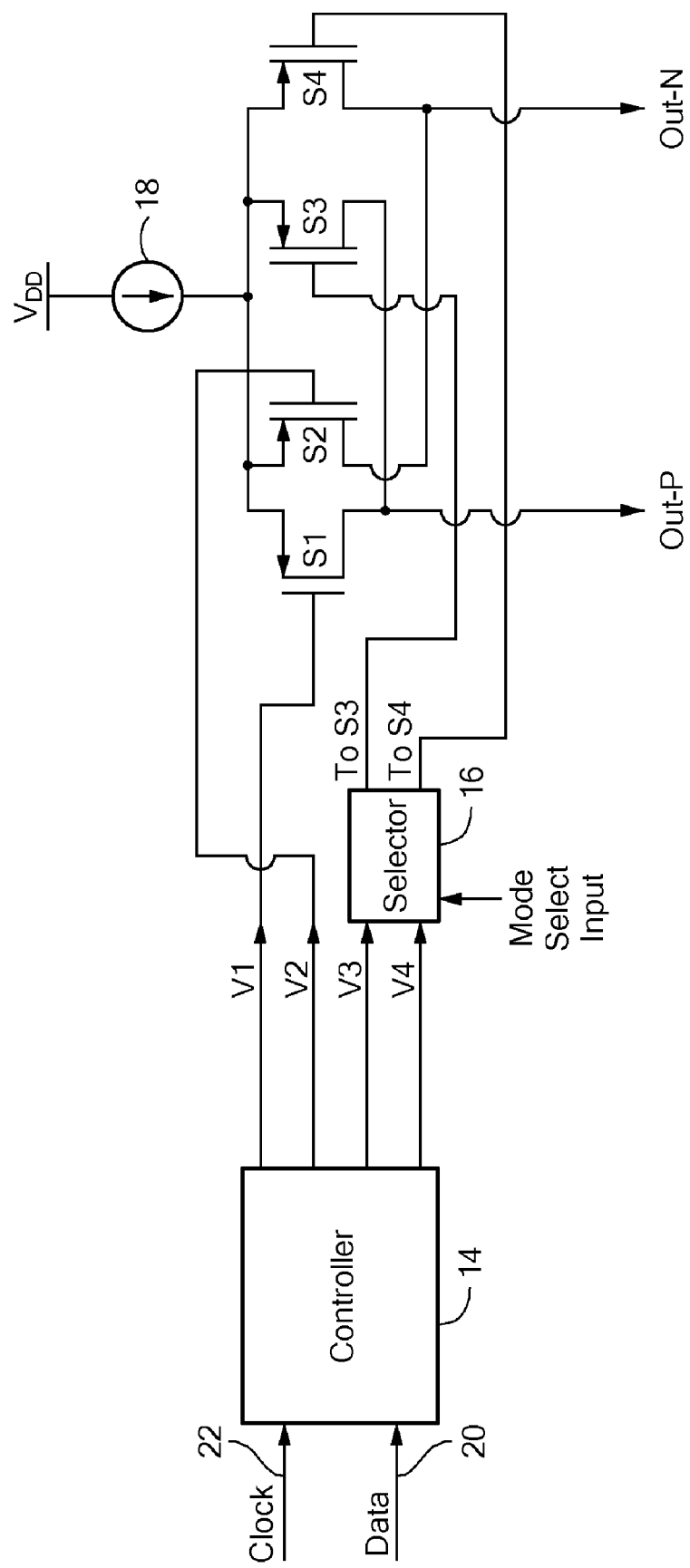
FIG. 3 schematically shows one embodiment of the circuit chip shown in FIG. 1.

FIG. 3 schematically shows additional details of the chip 10 shown in FIG. 1. For simplicity, the circuit shown in FIG. 3 processes digital data signals having amplitude values between zero and one. Such data is known in the art as "one bit data." Those skilled in the art should understand that the circuit diagram shown in FIG. 3 can be expanded to process digital data signals having amplitudes represented by more than one bit. For example, as discussed below, the circuit of FIG. 3 has four switches S1-S4 for processing digital data signals having amplitudes represented by one bit. To process digital data signals having amplitudes represented by four bits, for example, the circuit should be expanded to have three more sets of four switches similar to the switches S1-S4. More generally, in illustrative embodiments, the switch apparatus 12 should have a total number of switches equaling the product of four and the total number of bits used to represent a digital data signal. Accordingly, discussion of this simplified four switch circuit should not be construed to limit various embodiments of the invention.

The circuit of FIG. 3 shows more detail of the switch apparatus 12, which, in this embodiment, has a differential output. For simplicity in this figure, additional details of the controller 14 and selector 16 are respectively shown in FIGS. 4 and 5, which are discussed below.

The switch apparatus 12 has a current source 18 that transmits a current to either one of two differential output nodes out-p and out-n via one of the noted switches S1-S4. To that end, no more than one of the four switches S1-S4 can be in an "on" state at any single time. For example, if switch S1 is on, then the other switches S2-S4 are off and thus, not conducting the current. In that case, the current flows to output node out-p and the current on output node out-n is zero. The differential output signal (out-p-out-n) therefore is +1. As a second example, when switch S2 is on, the other switches S1, S3 and S4 are off. The current therefore flows to output node out-n, which produces a differential output signal of -1.

The current source 18 and switches S1-S4 may be conventional devices known in the art. For example, the current source could be a conventional current mirror design. Moreover, in illustrative embodiments, the switches S1-S4 are P-channel MOSFETS. Accordingly, each switch S1-S4 is in an "off" state when a logic HIGH voltage is applied to its gate, and in an "on" state when a logic LOW voltage (e.g., zero volts) is applied to its gate. Of course, the chip 10 can use other types of devices as switches S1-S4. For example, the chip 10 can use N-channel MOSFETS if the current source from the power supply is changed to a current sink connected to ground.

The controller 14 therefore has logic for selectively applying voltages to the gates of the switches S1-S4. To that end, the controller 14 has two direct outputs generating voltages V1 and V2, and two indirect outputs generating voltages V3 and V4. As shown, the two direct outputs feed directly to switches S1 and S2. Conversely, the two indirect outputs feed directly to the selector 16, which itself has two outputs directly connected to switches S3 and S4.

As noted above and discussed in greater detail below, the selector 16 alternatively switches the voltages on the gates of each of the switches S3 and S4 between voltages V3 and V4, depending upon the mode. For example, when in the DAC mode, the selector 16 connects voltage V3 to switch S3, and voltage V4 to switch S4. When in the mixer mode, however, the selector 16 connects voltage V3 to switch S4, and voltage V4 to switch S3. As discussed below, this selective switching produces the output shown in FIG. 2.

In illustrative embodiments, the controller 14 is a logic circuit that produces voltages V1-V4 represented by the following equations:

V1=C-bar OR D-bar,

V2=C-bar OR D,

V3=C OR D-bar,

V4=C OR D.

where: C is the clock amplitude,
C-bar is the inverse of the value of C,
D is the amplitude for the data bit being processed,
D-bar is the inverse of the value of D, and
OR is the logical "OR" operation.

Table 1 below illustrates values for voltages V1-V4 when the clock and data have certain given values. Table 1 also shows the differential output values when in the mixer mode and when in the DAC mode. Of course, it should be noted that the values of Table 1 are illustrative and not intended to limit various embodiments.

TABLE 1

|  | C = 1, D = 1 | C = 0, D = 1 | C = 1, D = 0 | C = 0, D = 0 |
|---|---|---|---|---|
| V1 | 0 | 1 | 1 | 1 |
| V2 | 1 | 1 | 0 | 1 |
| V3 | 1 | 0 | 1 | 1 |
| V4 | 1 | 1 | 1 | 0 |
| Mixer Mode Output | +1 | −1 | −1 | +1 |
| DAC Mode Output | +1 | +1 | −1 | −1 |

Figure 4:
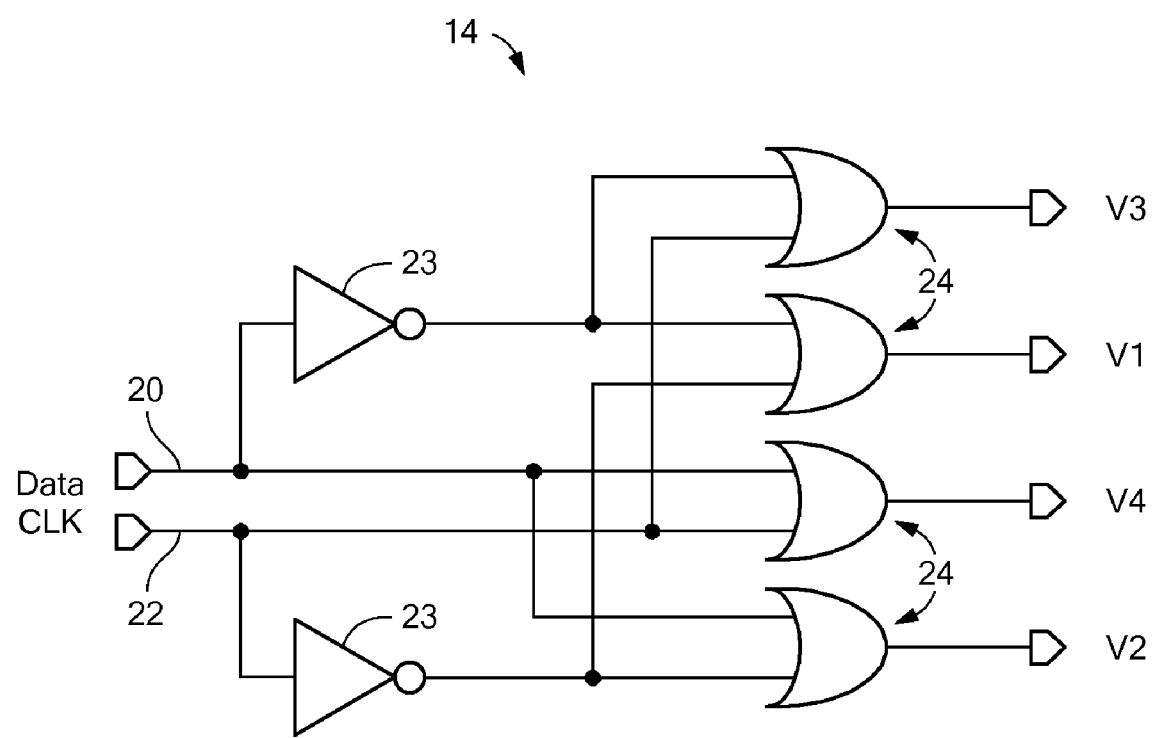
FIG. 4 schematically shows one embodiment of a switch controller used in embodiment shown in FIG. 3.

FIG. 4 schematically shows an illustrative circuit implementing those logical relationships. The circuit has the above noted data input 20 for receiving the digital data signal, and the above noted clock input 22 for receiving the clock signal. These inputs lead to a pair of inverters 23, that connect directly to the inputs of an array of logical OR gates 24. The logical OR gates 24 each have outputs that produce the noted voltages V1-V4. As noted above, the outputs producing voltages V1 and V2 directly connect to the switches S1 and S2, while the outputs producing voltages V3 and V4 connect directly to the selector 16.

Figure 5:
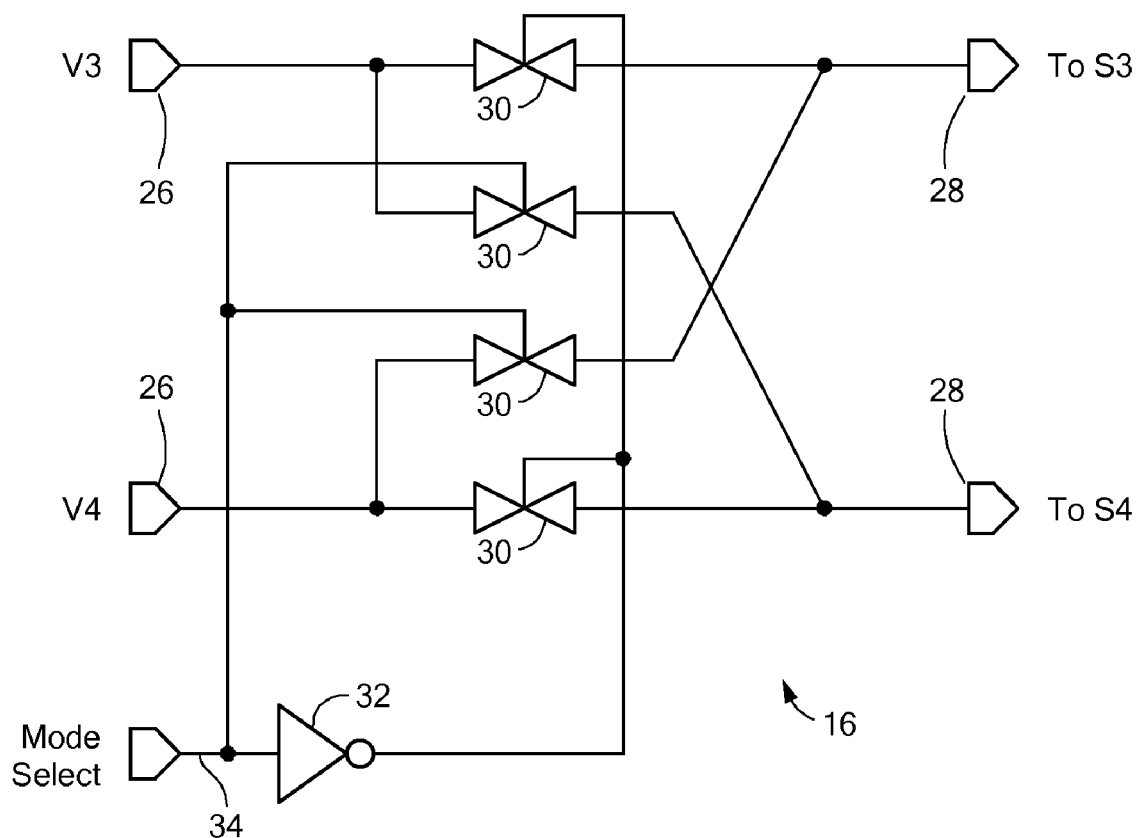
FIG. 5 schematically shows one embodiment of a selector used in embodiment shown in FIG. 3.

FIG. 5 thus schematically shows internal details of one embodiment of the selector 16, which simply redirects the voltages V3 and V4 as a function of the value of a mode select signal received at a mode select input 34. Specifically, the selector 16 has first and second input ports 26 for respectively receiving voltage V3 and V4, first and second output ports 28 coupled with switches S3 and S4, and circuitry between the input and output ports 26 and 28 to direct the input voltages between the input ports 26 and selected ones of the output ports 28. To that end, the circuitry includes an array of switches 30 connected in the manner shown, and an inverter 32 connected with between the mode select input 34 and two of the switches 30.

As an example, the switches 30 may be the type that are in an "on" state upon receipt of a logical high signal. In that case, receipt of a mode select signal having a value of logical zero directs the voltage V3 to switch S3, and the voltage V4 to switch S4. Conversely, receipt of a mode select signal having a value of one directs the voltage V3 to switch S4, and the voltage V4 to switch S3. The mode select input 34 can directly connect to a pin extending from the chip 10, thus enabling the chip 10 to be manually set to either of the two modes.

Of course, in a manner similar to other components within the chip 10, the circuit elements implementing the controller 14 and selector 16 are illustrative and not intended to limit various embodiments of the invention. Accordingly, one of ordinary skill in the art could use other circuits to achieve the same results.

Figure 6:
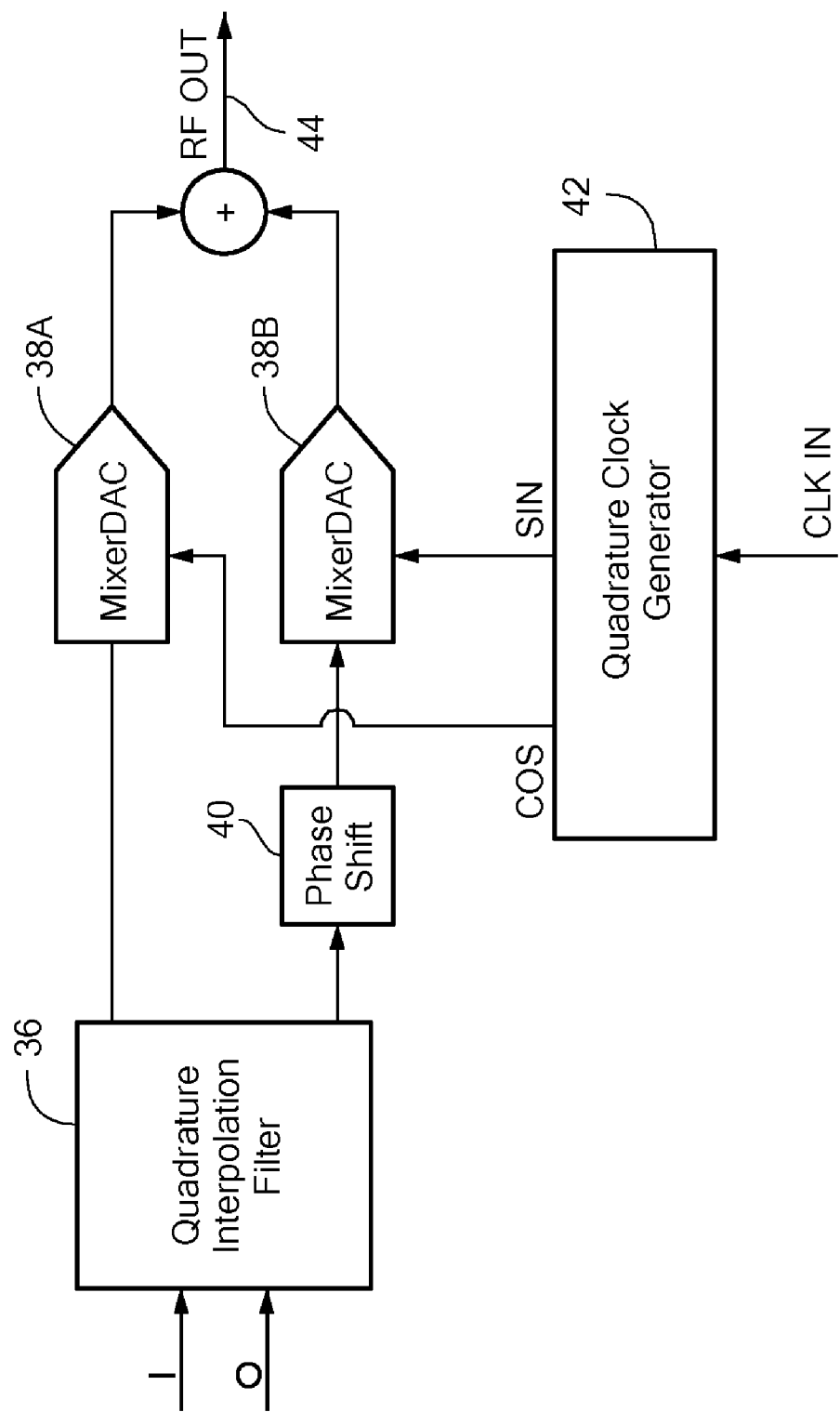
FIG. 6 schematically shows a quadrature mixer digital-to-analog converter architecture in accordance with illustrative embodiments of the invention.

Illustrative embodiments of the invention can process both real and imaginary data to implement a quadrature mixer. For example, in a single sideband mixer mode, a quadrature baseband signal may be up-converted to a RF band with one sideband being suppressed. FIG. 6 schematically shows a block diagram of such an apparatus. The circuit of FIG. 6 has a quadrature interpolation filter 36 that couples directly with a first mixer/DAC chip 38A, and to a second mixer/DAC chip 38B via a phase shift module 40. A quadrature clock generator 42 feeds signals to the respective mixer/DAC chips 38A and 38B. The output of the mixer/DAC chips 38A and 38B is summed at an output 44.

Accordingly, illustrative embodiments of invention implement a chip that efficiently uses the same components to either convert a digital signal into an analog signal, or mixes a digital signal to form an analog signal having a different frequency than that of the digital signal. A simple mode select signal controls the specific type of functionality to be used.

Although the above discussion discloses various exemplary embodiments of the invention, it should be apparent that those skilled in the art can make various modifications that will achieve some of the advantages of the invention without departing from the true scope of the invention.

What is claimed is:

1. An electronic chip comprising:
    a data input for receiving a digital data signal having a data frequency;
    a plurality of switches; and
    a logic circuit operatively coupled with the plurality of switches and the data input, the logic circuit controlling the switches to be in one of a DAC mode or a mixer mode,
    DAC mode causing the switches to convert the digital data signal into a DAC analog signal having about the data frequency,
    the mixer mode causing the switches to convert the data signal into a mixer analog signal having a mixer frequency that is higher than the data frequency.

2. The chip as defined by claim 1 further comprising a clock input for receiving a clock signal having a clock frequency, the frequency of the mixer analog signal being a function of the clock frequency.

3. The chip as defined by claim 2 wherein the mixer frequency increases when the clock frequency increases, the mixer frequency decreasing when the clock signal decreases.

4. The chip as defined by claim 1 wherein the data input has an interface for receiving a given number of bits representing the digital data signal, the plurality of switches having a total number of switches, the total number being the product of the given number of bits and four.

5. The chip as defined by claim 1 wherein the plurality of switches comprises a first pair of switches and a second pair of switches, the first pair coupled to a first switch output node, the second pair coupled to a second switch output node, the logic controlling the pairs to ensure that no more than one of the switches in the two pairs is closed at a single time.

6. The chip as defined by claim 5 further comprising a clock input for receiving a clock signal having a clock frequency, the logic circuit controlling the two pairs of switches so that no one of their switches is closed for two consecutive half-cycles of the clock signal.

7. The chip as defined by claim 5 wherein the logic circuit produces four control signals, each of the switches in the two pairs of switches receiving one of the four control signals, the logic circuit forwarding a given one of the four control signals to one of the switches when in the DAC mode, the logic circuit forwarding the given control signal to another of the switches when in the mixer mode.

8. The chip as defined by claim 7 wherein the logic circuit forwards the given control signal to one of the switches in the first pair when in the DAC mode, the logic forwarding the given control signal to one of the switches in the second pair when in the mixer mode.

9. The chip as defined by claim 1 further comprising means for processing both real and imaginary data to implement a quadrature mixer.

10. A mixer chip comprising:
    a data input for receiving a digital data signal having a data frequency;
    a first pair of switches;
    a second pair of switches;
    a differential output having a first node and a second node, the first pair of switches being coupled with the first node, the second pair of switches being coupled with the second node; and
    a logic circuit using a clock signal with a clock frequency, the logic circuit causing the first pair and second pair to alternatively produce a signal on their respective nodes for each half-cycle of the clock signal when in a mixer mode, the differential output producing an analog output signal.

11. The mixer chip as defined by claim 10 wherein the logic circuit controls the two pairs of switches to be in one of a DAC mode or the mixer mode,
    the DAC mode causing the switches to convert the digital data signal into a DAC analog signal having about the data frequency,
    the mixer mode causing the switches to convert the data signal into a mixer analog signal having a mixer frequency that is higher than the data frequency.

12. The mixer chip as defined by claim 11 wherein the logic circuit produces four control signals, each of the switches in the two pairs of switches receiving one of the four control signals, the logic circuit forwarding a given one of the four control signals to one of the switches when in the DAC mode, the logic circuit forwarding the given control signal to another of the switches when in the mixer mode.

13. The mixer chip as defined by claim 12 wherein the logic circuit forwards the given control signal to one of the switches in the first pair when in the DAC mode, the logic forwarding the given control signal to one of the switches in the second pair when in the mixer mode.

14. The mixer chip as defined by claim 11 wherein the analog output signal has a frequency that is about a multiple of the clock signal when in the mixer mode.

15. The mixer chip as defined by claim 10 wherein the logic circuit controls the two pairs of switches so that no one of their switches is closed for two consecutive half-cycles of the clock signal.

16. A method comprising:
    providing a first pair of switches coupled with a first output node;
    providing a second pair of switches coupled with a second output node, the two pairs of switches being on a single chip;
    receiving a clock signal having a clock frequency;
    receiving a digital data signal having a data frequency, the switches producing an output signal on no more than one of the first and second output nodes; and
    selecting whether the switches are to be in a mixer mode or a DAC mode,
    the switches cooperating to convert the digital data signal into an analog data signal having about the data frequency when in the DAC mode,
    the switches cooperating to switch the output signal between the first and second output nodes every half-cycle of the clock signal when in the mixer mode.

17. The method as defined by claim 16 further comprising using the differential output signal between the first output node and the second output node to produce a final signal.

18. The method as defined by claim 16 wherein when in the mixer mode, the final signal has a final signal frequency that is a multiple of the clock frequency.

19. The method as defined by claim 16 wherein the data signal remains substantially constant for each full-cycle of the clock signal.

20. The method as defined by claim 16 wherein selecting comprises causing a logic circuit to produce a logic signal that causes the switches to be in either the DAC mode or the mixer mode, the logic circuit being on a different chip than that of the switches.

* * * * *

UNITED STATES PATENT AND TRADEMARK OFFICE
CERTIFICATE OF CORRECTION

PATENT NO. : 7,796,971 B2
APPLICATION NO. : 11/686620
DATED : September 14, 2010
INVENTOR(S) : Yunchu Li et al.

It is certified that error appears in the above-identified patent and that said Letters Patent is hereby corrected as shown below:

In Col. 7, line 29
insert --the-- before "DAC"

Signed and Sealed this

Twenty-third Day of November, 2010

David J. Kappos
*Director of the United States Patent and Trademark Office*